United States Patent [19]

Edwards

[11] Patent Number: 5,130,678
[45] Date of Patent: Jul. 14, 1992

[54] TRANSMISSION LINE TRANSFORMER WITH DC ISOLATION

[75] Inventor: Richard C. Edwards, Cedar Rapids, Iowa

[73] Assignee: Rockwell International Corporation, Seal Beach, Calif.

[21] Appl. No.: 787,691

[22] Filed: Oct. 31, 1991

Related U.S. Application Data

[63] Continuation-in-part of Ser. No. 554,314, Jul. 17, 1990, abandoned.

[51] Int. Cl.$^5$ .......................... H03H 7/00; H01P 5/00
[52] U.S. Cl. ..................................... 333/24 R; 333/33; 333/28 R; 336/195
[58] Field of Search ....................... 333/119, 131, 24 R, 333/32, 33, 28 R; 336/175, 195

[56] References Cited

U.S. PATENT DOCUMENTS

| | | | |
|---|---|---|---|
| 2,865,006 | 12/1958 | Sabaroff | 333/33 |
| 3,453,574 | 7/1969 | De Parry | 336/195 X |
| 3,717,808 | 2/1973 | Horna | 336/195 X |

*Primary Examiner*—Paul Gensler
*Attorney, Agent, or Firm*—John J. Horn; M. Lee Murrah; H. Fredrick Hamann

[57] ABSTRACT

A transmission line transformer (20, 30, 31) with inherent DC isolation has two sets (22, 22') of transmission line elements (ZN) with characteristic impedances which vary from relatively high values near the transformer inputs (P1, P2) to relatively low values near an intermediate location (28, 28') are ordered in a mirror image symmetry with respect to one another relative to the intermediate location (28, 28') in plural element embodiments (20, 30). The primaries (24, 24') are connected in series, while the secondaries (26, 26') of adjacent pairs of transmission line elements (ZN, ZN') are connected in series with the series connected pair connected in parallel across the output terminals (P3, P4). A center line transmission element (CZN) at the intermediate location (28') has a substantial zero impedance, and an electrical length equal to twice that of the other elements. In an embodiment (31) for the special case of N=1, the other transmission line elements of the two sets (22, 22') are eliminated and only a single center transmission line element (CZN) with approximately zero characteristic impedance is employed to obtain a broad band flat frequency response.

30 Claims, 7 Drawing Sheets (SOLID LINE PLOTS)
LINE LENGTH (PERCENTAGE OF WAVELENGTHS)

| N | $Z_1$ | $Z_2$ | $Z_3$ | $Z_4$ | $Z_5$ | $Z_6$ | $Z_7$ |
|---|---|---|---|---|---|---|---|
|   |   |   | IMPEDANCE (OHMS) |   |   |   |   |
| 1 | 0.000 |   |   |   |   |   |   |
| 2 | 21.651 | 7.217 |   |   |   |   |   |
| 3 | 23.570 | 11.785 | 0.000 |   |   |   |   |
| 4 | 24.179 | 19.780 | 9.234 | 2.074 |   |   |   |
| 5 | 24.507 | 21.944 | 12.913 | 4.627 | 0.000 |   |   |
| 6 | 24.700 | 23.205 | 18.758 | 10.437 | 4.324 | .951 |   |
| 7 | 24.789 | 23.713 | 20.746 | 13.352 | 6.824 | 2.420 | 0.000 |

|   | ———IMPEDANCE (OHMS)——— | | | | | ——LOSS (DB)—— | |
|---|---|---|---|---|---|---|---|
| N | $Z_1$ | $Z_2$ | $Z_3$ | $Z_4$ | $Z_5$ | 12.5% | 25% |
| 1 | 5.000 |   |   |   |   | 0.007 | 0.043 |
| 2 | 25.000 | 10.000 |   |   |   | 0.048 | 0.193 |
| 3 | 25.000 | 10.000 | 5.000 |   |   | 0.003 | 0.192 |
| 4 | 25.000 | 25.000 | 10.000 | 5.000 |   | 0.173 | 0.633 |
| 5 | 25.000 | 25.000 | 12.500 | 5.000 | 5.000 | 0.033 | 5.392 |

FIG. 9A
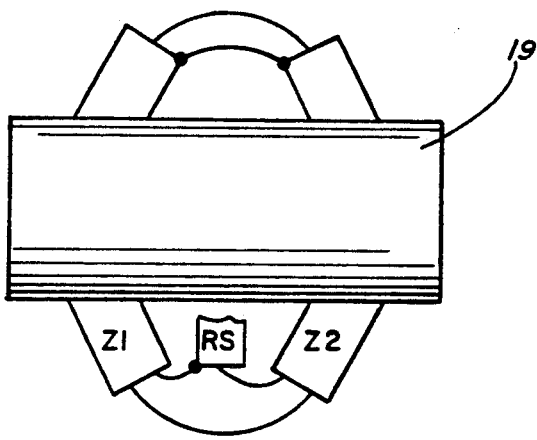
FIG. 9B
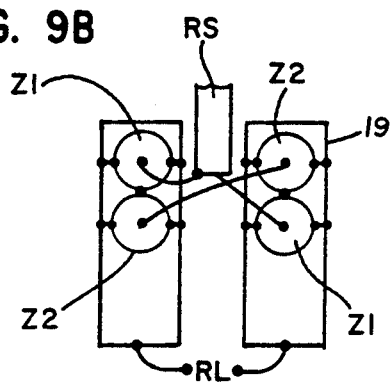
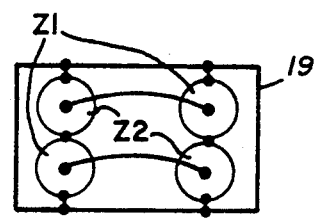
FIG. 9C
FIG. 9D
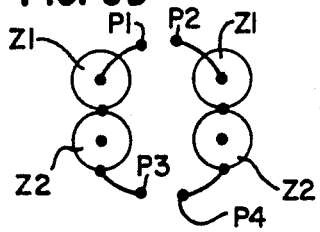
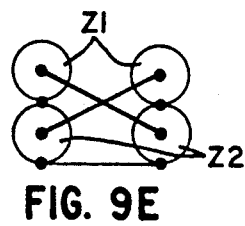
FIG. 9E
FIG. 9I
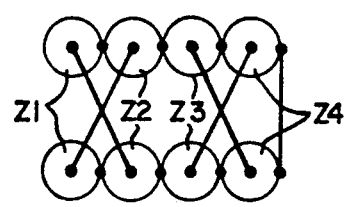
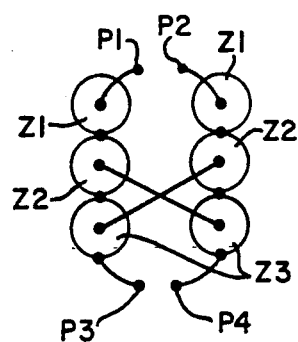
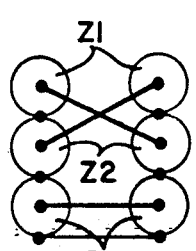
FIG. 9G
FIG. 9H
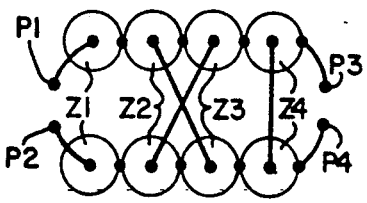
FIG. 9F

TRANSMISSION LINE TRANSFORMER WITH DC ISOLATION

This application is a continuation-in-part of application Ser. No. 07/554,314 filed Jul. 17, 1990, now abandoned.

BACKGROUND OF THE INVENTION

1. Technical Field

This invention relates to electrical transformers and, more particularly, to a broad band transmission line transformer with inherent DC isolation.

2. Background Art

Ideal transmission line transformers with integer turns ratios but without DC isolation are well known. These transmission line transformers are considered ideal because when the even mode impedance is suppressed and the even mode characteristic impedance is very large, the response is independent of frequency while the transmission lines remain in the TEM mode.

Inherent DC isolation in such a transformer is especially desirable in high power amplifier designs, since high voltage, high current, high Q coupling capacitors can be eliminated. DC isolation transmission line transformers are available, but these are substantially frequency dependent. In NASA Tech Briefs, "Coaxial Cable on Toroid Yields Wide-band Transformer", *Electronic Design*, pp. 108–109, Jun. 21, 1967, such a transformer is described, but its frequency response falls above ten Mhz. A similar transformer is shown in H.D. Granberg, "Broadband Transformers and Power Combining Techniques for RF", Motorola Application Note AN-749, 1975, but it has considerable performance degradation for frequencies less than 175 Mhz. Other DC isolation transmission line transformers are shown in H.O. Granberg, "New MOSFETs Simplify High Power RF Amplifier Design", *RF Design*, PP 43-52, Oct. 1986 and H.O. Granberg, "Building Push-Pull Multioctave, VHF Power Amplifiers", *Microwaves and RF*, pp. 77–86, Nov. 1987.

The present invention was developed from an attempt to modify the prior art transmission line transformer 10 of FIG. 1 to render it frequency insensitive over a wide band frequency range. In this prior art transformer 10, a plurality N of substantially identical transmission line elements LE-1 through LE-N, generally referred to as LE-N, are provided in the form of coaxial cables. All of the coaxial cables have the same characteristic impedance Z, and all have the same electrical length. The primary 12 of each transmission line element LE-N is preferably defined by a center conductor of a coaxial cable segment, and the secondary 14 is preferably defined by an outer conductor. The coaxial cable segments are turned around one or more ferrite cores 19.

The primaries 12 of all of the transmission line elements LE-N are connected in series between a pair of input terminals P1 and P2 by means of suitable electrical connections 16. The input terminal P1 is connected between a source VS of AC signals through a series source impedance RS, and the input terminal P2 is connectable to ground at the other side of source VS. The secondaries 14, on the other hand, are connected in parallel with each other and with a pair of output terminals P3 and P4. Output terminals P3 and P4 are shown connected with a load such as a coaxial feed line to a transmitting antenna having an impedance RL.

The theoretical frequency response of the prior art transformer of FIG. 1 is shown in FIG. 2 in solid line plots for $N=1$ through $N=7$ for different, nonzero, equal values of characteristic impedances Z of LE-N. $RL=1$ is assumed for simplicity. The abscissa variable is the length of the transmission line winding in percentage of wavelengths and the ordinate variable is the transmission gain in dB. Since the lines are assumed lossless, the transmission gain and loss is also equal to the mismatch gain and loss.

Each transmission line element LE-N comprises one turn. Accordingly, there are N equivalent turns on the primary side connected to load RL. The secondary side consists of N turns, but since they are connected parallel, the N turns are equivalent to a single turn. Thus, a turns ratio of N:1 is realized corresponding to an impedance ratio of $N^2 = RS/RL$.

The solid line plots in FIG. 2 are for values of $Z = ZO$ from the equation (1) below recommended in the first reference of Granberg discussed above.

$$ZO = \sqrt{RS \times RL} = RL \times N = RS/N \qquad \text{Equation (1):}$$

As shown in FIG. 2, there is substantial frequency sensitivity for all recommended values of ZO between one and 21 for values of N between one and seven.

SUMMARY OF THE INVENTION

It is therefore an object of the present invention to provide a transmission line transformer with DC isolation and with a substantially uniform frequency response over a broad range of frequencies. This frequency independence is obtained by arranging plural transmission line elements in a selected order of varying characteristic impedance instead of providing all elements with the same characteristic impedance in the case of known transmission line transformers. In the case of a single transmission line element, it has been discovered that substantial frequency independence is achieved by using a transmission line element with a substantially zero characteristic impedance.

In plural element forms of the invention, the transmission line transformer has first and second sets of transmission line elements arranged in a selected series order of varying characteristic impedance between a intermediate reference location and two input terminals of the transformer, respectively. The series order of the varying characteristic impedance of the second set of transmission line elements is selected relative tot he varying characteristic impedance of the first set of transmission line elements for optimum frequency independence and low insertion loss.

In one plural element form of the preferred embodiment, each set of elements has an equal number of elements between the reference location and the associated input terminal, and the characteristic impedances decrease in a direction from the input to the reference location. The secondaries of selected groups of the transmission line elements of each set, preferably adjacent pairs, are connected in series as a group, with the series connected group of secondaries connected in parallel across a pair of output terminals of the transformer. For each group of the first set thee is another group of the second set having the same number of transmission line elements with substantially the same characteristic impedances and arranged symmetrically with respect to the intermediate reference location.

In a second plural element form of the preferred embodiment, a center transmission line element is added to the first form at the intermediate reference location and connected between the first and second sets. The impedance of the center transmission line element is substantially less than all the impedances of the elements of the first and second sets. Preferably zero, and has an electrical length which is twice that of each of the transmission line elements of the first and second sets.

In both of the plural element forms of the invention, the transmission line elements are of optimum length for the frequency bandwidth of the transformer. Also, the varying characteristic impedances of the second set of transmission line elements mirror the varying characteristic impedances of the first set of transmission line elements relative to the intermediate reference location. All elements are of the same optimum length except the center transmission line element of the second plural element form which is twice the length of the other elements or the equivalent of two optimum lengths in cascade. The term optimum length is hereafter defined as the transmission line length which when used with the desired ferrite/iron core results in minimum unwanted even mode current (i.e., unwanted extraneous current flowing from any ungrounded node) over the bandwidth of the transformer as is may be determined in accordance with well known empirical methods.

In a special case, all of the transmission line elements except the center transmission line element are eliminated, and the center transmission line element is given a substantially zero characteristic impedance to achieve a flat frequency response.

BRIEF DESCRIPTION OF THE DRAWINGS

The foregoing objects, features and advantages will be explained in greater detail and other objects, features and advantages will be made apparent from the following detailed description of the preferred embodiments which is given with reference to several figures of the drawing, in which:

FIGS. 9A, 9B and 9C are construction illustrations of tip, front and rear views of a transmission line transformer of the form of FIG. 3 for the case of N equal to two when N is the number of transmission line elements in each set of elements;

FIGS. 9D and 9E are construction illustrations of front and back views of symmetrically connecting the lines of FIG. 3 for the case of N equal to two;

FIGS. 9F and 9G are front and back views of a transmission line transformer of the form of FIG. 4 for the case of N equal to three and having symmetrical connections;

FIGS. 9H and 9I are back and front views of a transmission line transformer of the form of FIG. 3 for the case of N equal to four and having symmetrical connections;

DETAILED DESCRIPTION

It was discovered that by varying the impedance values of LE-1, LE-2, . . . LE-N in the transformer of FIG. 1 without constraining the characteristic impedances to be equal to one another, the performance of the prior art transformer of FIG. 1 could be improved. Referring again to FIG. 2, the dashed lines plots are for $Z=ZO$ where $ZO$ is defined by the Equation (1), below.

Equation (2):
$$ZO = (RS - \sqrt{RS \times RL})/2 =$$
$$RL \times N(N-1)/2 = RS(N-1)/(2N).$$

$ZO$ is the actual low frequency V/I for the transmission lines if driven from a balanced source between P1 and P2.

From a study of this plot, it was determined that for $N=1$, if the characteristic impedance Z were reduced to zero, instead of the substantially nonzero values recommended by the prior art, the frequency response would be ideal—i.e. 0 db transmission loss for all frequencies. The dashed line plot 21 shows the response for $N=1$ with the characteristic impedance Z equal to a zero impedance approximation of 12.5 ohms for a 50 ohm transformer. By comparing the dashed plots for higher values of N with the corresponding solid curves, it was also discovered that determination of characteristic impedances using the equation for ZO in the Equation (2) results in better frequency performance than when using Granberg's formula (equation (1) for Z, and that it is preferably to drive the transformer from a balanced source. This lead to the third form of the invention shown in FIG. 5, which is similar to the prior art transformer shown in FIG. 1 except for provision of a substantially zero characteristic impedance for the transmission line element and the use of a balanced source, as described below.

Figure 1:
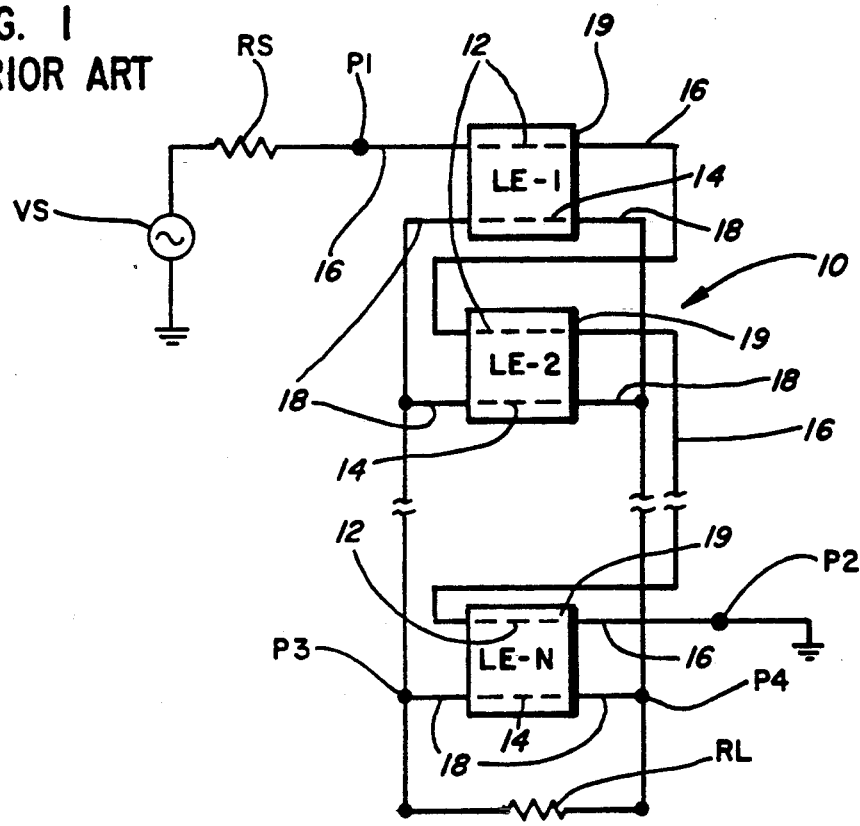
FIG. 1 is a block diagram of a prior art transmission line transformer.
Figure 2:
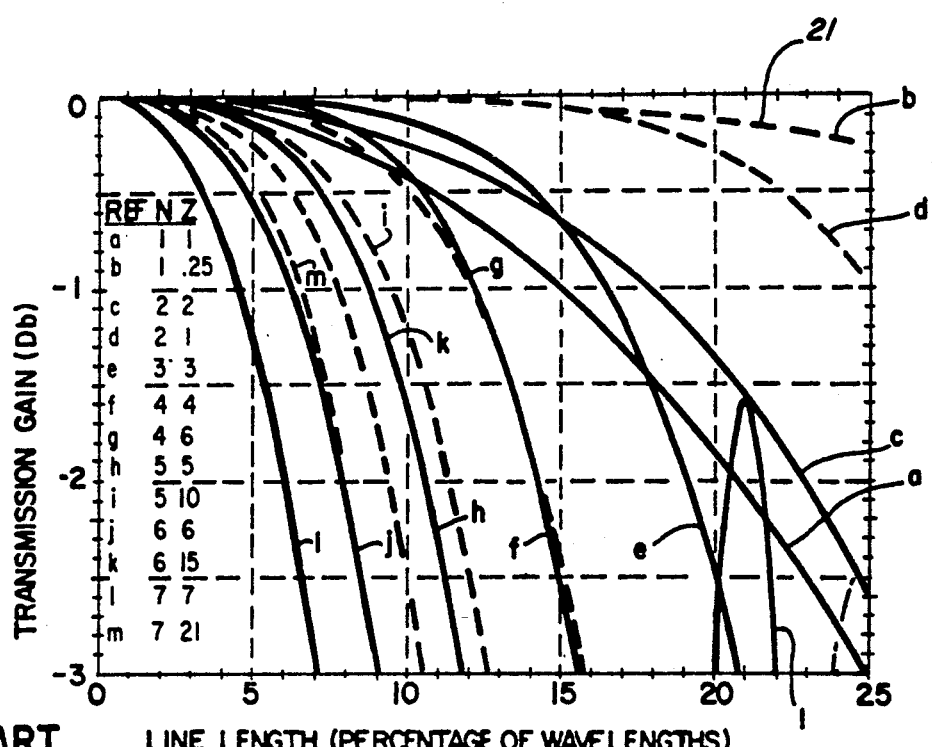
FIG. 2 is a graph in solid line plots of the frequency response of the prior art transmission line transformer of FIG. 1 using recommended values of characteristic impedance for N=1-7.

Unfortunately, there is considerable frequency degradation for any choice of N other than 1 (While not plotted in FIG. 1, the $Z=O$, $N=1$, curve remains at 0 db for all wavelengths). In this regard, it should be noted that even a 0.5 db loss is not acceptable for a practical transformer because such a loss corresponds to a 2:1 input VSWR. The resultant transmitter load line could be either twice or half of what it should be. A 4:1 impedance variation cannot be tolerated in most designs because of either efficiency or distortion considerations.

Accordingly, more complex yet practical topologies were invented as shown in FIGS. 3, 4, 7 and 8 which can achieve the ideal goal of 0 db loss at all frequencies/wavelengths when the correct selected characteristic impedance values are employed. As N goes to infinity the characteristic impedances of the first, or Z1, transmission lines that connect directly to the source impedance, approach the value of RS/2 which is also the value of ZO computed by using Equation (2). The ideal line impedances become progressively lower towards the center of the winding.

Figure 3:
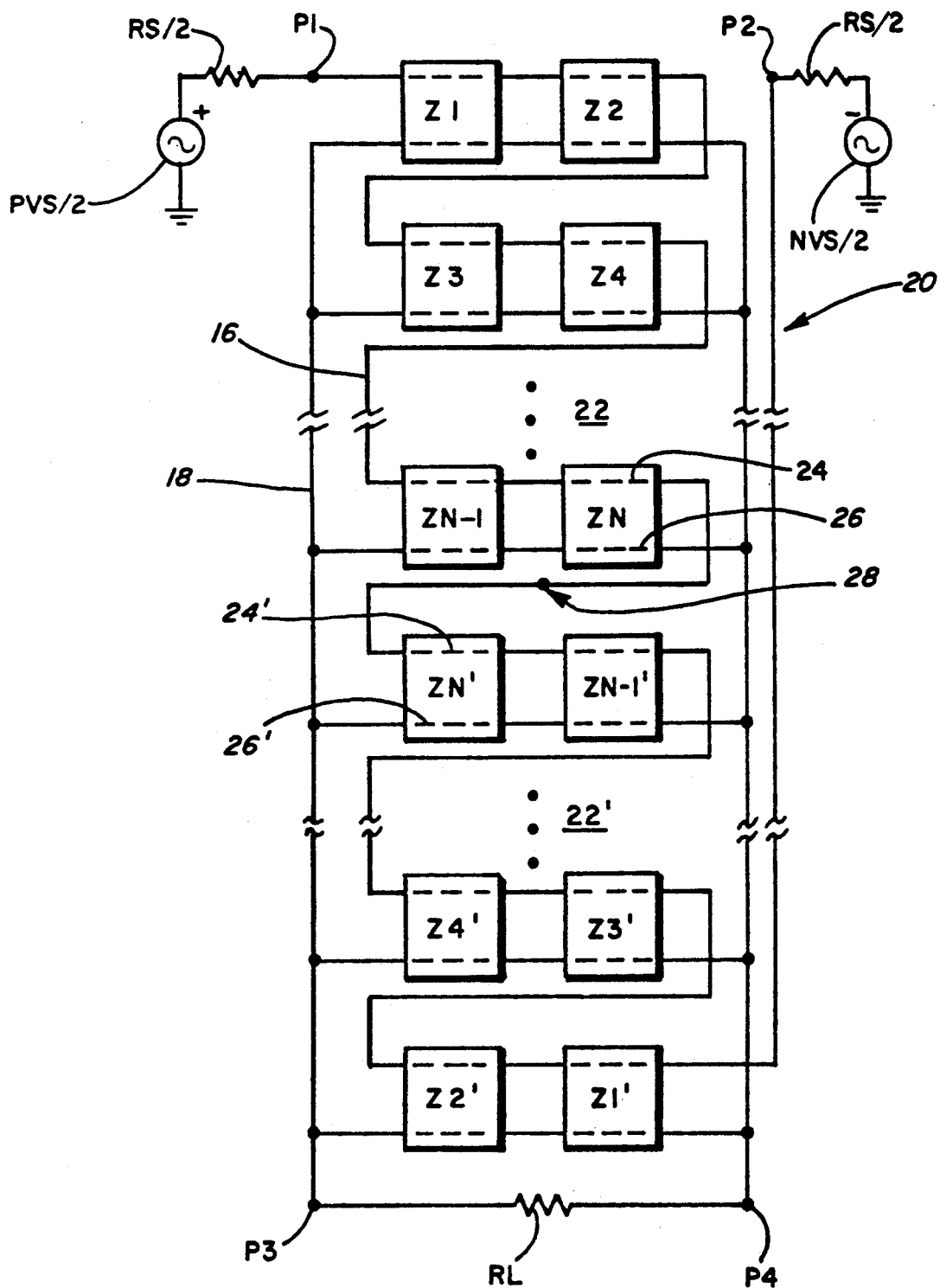
FIG. 3 is a block diagram of a first plural element form of the preferred embodiment of the transmission line transformer of the invention for the case in which there is no center transmission line element.

Referring to FIG. 3, the first form of the preferred embodiment of the transmission line transformer 20 is seen to have a circuit configuration different from that of FIG. 1 in addition to the fact that the characteristic impedance values of the transmission line elements Z1 - Zn, generally referred to as ZN, vary. As discussed above, in order to optimize performance, the transformer is preferably driven by a balanced bipolar source with a positive section formed by an AC source PVS/2 driving an input terminal P1 between ground and a positive voltage PVS/2 through a source impedance RS/2 and a complementary negative section with an AC source NVS/2 for driving another input terminal P2 between a negative voltage NVS/2 and ground through a source resistor RS/2. The load RL is connected across output terminals P3 and P4. The transmission line elements are arranged in two sets 22 and 22', with each set having a plurality of transmission line elements Z1 -ZN and Z1'- ZN', respectively made of twin lead or, preferably, of coaxial cable segments, or the like. Each of the transmission line elements ZN of the first set 22 has a primary 24(preferably the center conductor of a coax cable) and a secondary 26 (preferably the shield conductor of a coax cable), and each transmission line element ZN' of the second set 22' has a primary 24' and secondary 26'. The primaries are coupled together by connections 16 and the secondaries are coupled by connections 18.

Figures 5, 6A, 6B:
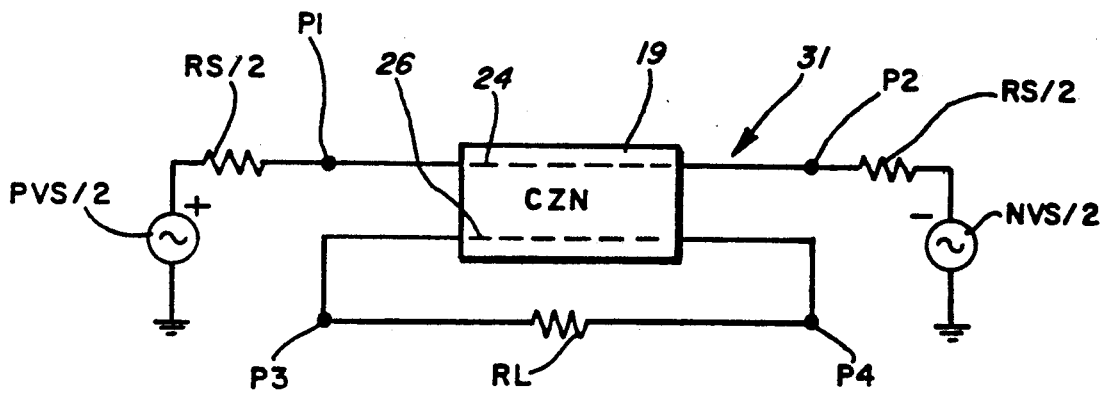
FIG. 5 is a block diagram of a third form of the preferred embodiment of the transmission line transformer of the present invention for the special case of the second form of embodiment of FIG. 4 in which only the transmission line element has been provided and all the other transmission line elements have been eliminated.
FIG. 6A is a table of ideal characteristic impedance values of N transmission line elements Z for a source impedance of fifty ohms for even values of N equal to two through six for optimum frequency response of the form of FIG. 3 and for odd values of N equal to one through seven for optimum frequency response of the forms of FIGS. 4 and 5.
FIG. 6B is a table of characteristic impedance values of the transmission line elements of commercially available transmission line elements which approximate the characteristic impedance values of FIG. 6A for a source impedance of fifty ohms and values of N equal to one through five.

Unlike known transmission line elements, the first set 22 of transmission line elements are arranged in a selected order of varying characteristic impedance in the series connection of their primaries 24 between the input P1 and an intermediate reference location 28. The secondary 26 of each element Z1 - ZN is connected in parallel with the pair of output terminals. The second set 22' of transmission line elements Z1'-ZN', with impedance values, preferably equal to those of elements, respectively, Z1 - ZN likewise have their primaries 24' connected in series between the other input terminal P2 and the intermediate reference location 98. Their secondaries 26' are connected in parallel with each other and across the output terminals P3 and P4 and the load RL. Like the first set 22, the second set of transmission line elements Z1'-ZN' are also arranged in a series order of varying characteristic impedance selected relative to the varying characteristic impedance of the first set 22 of transmission line elements for optimum frequency independence and low insertion loss. Preferably, the impedance value of ZN equals that of ZN' for all values of N and the ideal impedance values are those shown in FIG. 6A for even values of $N=2-6$. Approximations of the ideal values are shown in FIG. 6B for even values of $N=2-4$.

Preferably, the secondaries of selected ones of the transmission line elements ZN and ZN' of each set 22 and 22' are connected in series, such as adjacent pairs of elements ZN and ZN-1, Z4 and Z3, and Z2 and Z1. The series connection of the secondaries of each group are connected in parallel with the load RL across the output terminals P3 and P4. Preferably, all groups have the same number of transmission line elements, such as tow. Moreover, preferably for each group, of the first set 22, there is another group of the second set 22' having the same number of transmission line elements with substantially the same characteristic impedances and arranged in mirrored symmetry with respect to the intermediate reference location.

The ratio of the characteristic impedance of the element having the highest characteristic impedance to the element having the lowest characteristic impedance for at least some of the groups, such as pairs Z1 and Z2 and Z3 and Z4, are approximately between two and three. Since the ideal characteristic impedances for ZN and approximate value of the ideal values of ZN for a source resistance RS of 50 ohms are respectively shown in FIGS. 6A and 6B, the ratio between these impedance values are the ideal and approximately ideal ratios for all the transmission line elements Z1-ZN and Z1'-ZN'. The tables of FIGS. 6A and 6B apply to the transformer 20 of FIG. 3 for only even values of N and apply to the transformer 30 of FIG. 4 only for odd values of N.

Figure 4:
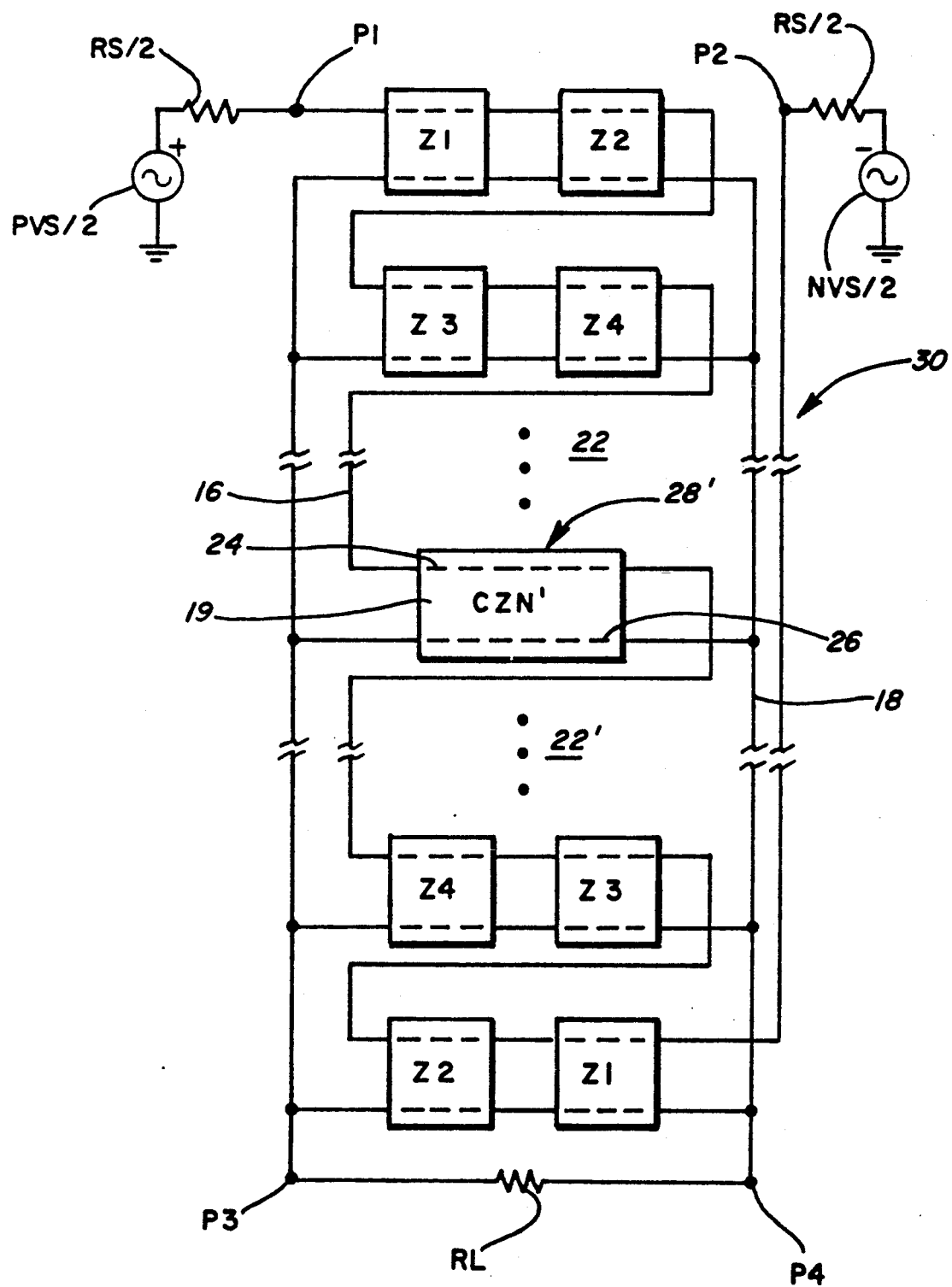
FIG. 4 is a block diagram of a second plural element form of the preferred embodiment of the transmission line transformer in which an additional center transmission line element has been added to the first form of FIG. 3.

Referring to FIG. 4, the second form 30 of the transmission line transformer is seen to be substantially the same as the first form 20 of FIG. 3 in topography except for addition of a center transmission line element CZN. Ideally, the center transmission line element CZN has a characteristic impedance equal to ZN of FIGS. 6A and 6B for odd values of N, approximately zero ohms and is provided at the intermediate reference location 28' between the first and second sets 22 and 22' of transmission line elements. The center transmission line element CZN has a primary 24 connected in series with the primaries of adjacent transmission line elements of of the first and second sets 22 and 22' and a secondary 26 connected in parallel across the pair of output terminals P3 and P4.

The center transmission lie element CZN has substantially the lowest impedance of all the other transmission lien elements of the first and second sets 22 and 22'. Preferably, the characteristic impedance of CZN is approximately zero relative to the impedance of the other elements. As with the first form of the transmission line transformer of FIG. 3, the impedances of the transmission line elements of the first and second sets 22 and 22' increase in value in a direction outwardly from the intermediate reference location 28' and element CZN to the input terminals P1 and P2.

The length of the transmission line elements are optimum as previously defined and special element, CZN, is twice this optimum length.

Referring now to FIG. 5, and embodiment 31 for the special case of $N=1$ is shown in which only a single center transmission line element CZN remains. Its primary 24 is connected between the inputs P1 and P2 respectively connected to the two sections of the push pull amplifier formed by PVS/2 and NVS2. Its secondary 26 is connected across the output terminals P3 and P4 and load RL. The characteristic impedance of $CZN=ZN$ is ideally zero, although, as shown in FIG. 6B, even with a characteristic impedance approximating zero as high as five ohms results in significant advantage. As with transmission line element CZN of FIG. 4, transission line element CZN has as short a length as possible without performance degradation typically less than one-half wave length, and the transmission line element CZN is wound around a ferrite core 19.

The characteristic impedances for the $N=1$ through $N=3$ of FIG. 6A can be determined from explicit equations that were derived. For $N=1$, the characteristic impedance of element Z is zero. For $N=2$, $Z1=RL\sqrt{3}$, $Z2=RL\sqrt{3}$ where $RL=RS/4$. For $N=3$, $Z1=\sqrt{RLxRSx\sqrt{2}}$, $Z2=\sqrt{RLxRS/\sqrt{2}}$ and $Z3=0$, when $RL=RS/9$. For N greater than three, the optimum values were found by conventional compute optimization using equations for the transfer functions of the transmission line elements for selected values of N. It is recommended that optimum solutions for additional values of N should be checked by confirming the return loss is greater than 40 dB for one hundred data points representing less than one to several hundred percent wavelengths.

For $N=1$ and for all odd numbers of N, the center transmission line element CZN with a characteristic impedance of zero is required. Fortunately, such extremely low values are not necessary for satisfactory performance. For a fifty ohm transformer, changing the line characteristic impedance from 50 to 12.5 ohms results in a 2.75 dB improvement in mismatch loss.

Since typically only approximate line values are available, the table of FIG. 6B shows the resultant transformer mismatch loss at 12.5% and 25% wavelengths per turn for $RS=50$ ohms using standard values which are commercially available.

Any transformer with a integer turns ratio N1 can be cascaded with a second transformer with a ratio N2 to achieve the rational turns ratio, N1/N2. For example, if $N1=3$ and $N2=2$, the resulting turns ratio of 3/2 is obtained which is useful for approximating a 2:1 impedance transformation. One possible realization of such a 3:2 transformer 34 is achieved by cascading an $N=3$ transformer 38 of the form of FIG. 4 with an $N=2$ transformer 40 of FIG. 3 to produce composite transformer 34 shown in FIG. 7. The ideal characteristic impedances of RS, RL, Z1, Z2, Z3, ZA and ZB are 50 ohms, 22.22 ohms, 23.57 ohms, 11.78 ohms, 0.000 ohms, 9.622 ohms and 3.208 ohms, respectively. The two transformers have separate cores and interconnections in close proximity are used, or a common core can be used with the primary turn windings cross connected to avoid the equivalent of a shorted turn.

Figures 7, 8:
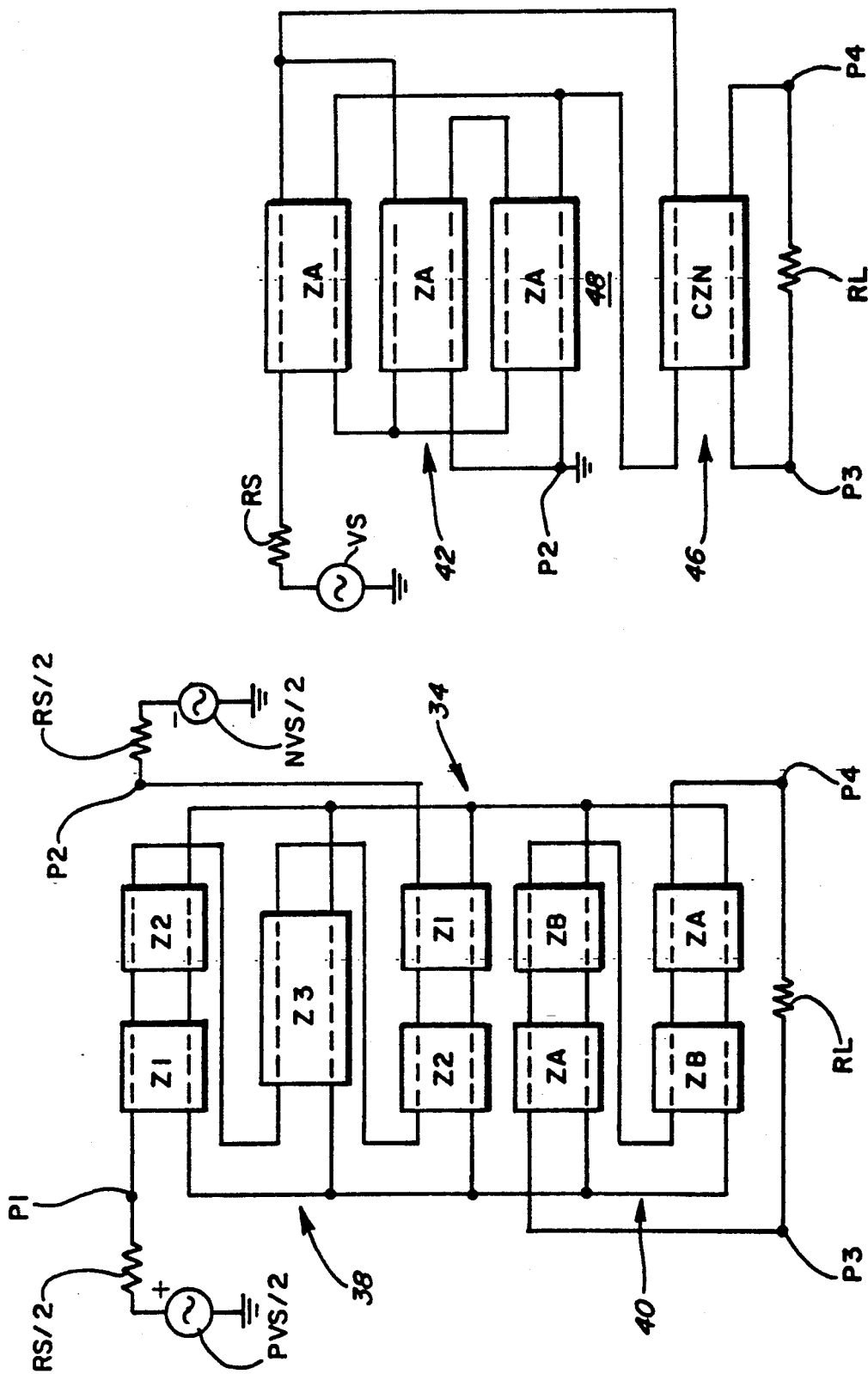
FIG. 7 is a block diagram of a composite transmission line transformer with N equal to 3/2 formed by cascading together the transmission line transformer of FIG. 3 with that of FIG. 4.
FIG. 8 is a block diagram of a composite transmission line transformer formed by cascading together a transmission line transformer without DC isolation with the transmission line transformer of FIG. 4 to provide DC isolation for the composite transformer with N equal to 3/2.

An even simpler approach however is to realize the rational turns ratio with a transformer without DC isolation of the prior art 42 with an $N=1$ isolation transformer 46 of the form of FIG. 5. An example of such a composite $N=3/2$ transformer 48 with DC isolation is shown in FIG. 8. Ideally, the characteristic impedances of RS, RL, ZA and CZN of the transformer 48 of FIG. 8 are 50 ohms, 22.22 ohms, 33.33 ohms and 0 ohms, respectively.

The required series connection of the line pairs Z1-Z2, Z3-Z4, Z4-Z5, etc. in FIGS. 3 and 4 can be realized by considering each line of the pair as one half turn as shown in FIGS. 9A, 9B and 9C. Alternatively, for smaller transformers where doubling the number of turns is practical, each line element can comprise a full turn. Ideally, each line pair is constructed with a continuous outer shield with an abrupt change in diameter of the center conductor. However, tapering the center conductor is also acceptable. The more practical construction techniques, however, make use of two separate cables for the transmission line pair.

The electrical lengths of the transmission line elements of sets 22 and 22' should be equal for best results. In the transformer 30 of FIG. 4 the central transmission line element CZN should have an electrical length equal to the total length of two transmission line elements. Whereas any total electrical length is acceptable for the desired odd mode impedances of the transformer of FIGS. 3 and 4, the actual length must optimumly suppress the undesired even mode currents across the bandwidth of the transformer.

It should be mentioned that the shields of coaxial cables which defined the secondaries 26 can always be connected together as shown in the views of FIGS. 9B and 9C, 9D, 9E, 9F, 9G, 9H and 9J. It is advisable to keep the lines close together to avoid long interconnections. For large values of N, the interconnection technique shown in FIGS. 9D, 9E, 9F, 9G, 9H and 9J is preferred. Not only is the structure symmetrical with identical transmission line elements for adjacent coaxial line segments ZN, but a long interconnection is avoided for the input coaxial cable ZS from the sources PVS/2 and NVS/2.

Since in FIGS. 9D and 9E, 9F and 9G and 9H and 9I the input is on top of the winding stack with the output at the bottom, this construction can be implemented by means of a strip line with multilayer boards. A central hole should be provided to accommodate the ferrite core, and the line impedances required for a given layer should be changed by varying the conductor width or dielectric thickness.

The even mode impedance can be made as high as possible by using suitable ferrite material in configurations such as illustrated in FIGS. 9A-9I and FIGS. 10A and 10B and FIGS. 11A, 11B, 11C and 11D. An effective low frequency magnetic coupling design should be used with a material that does not have too much loss throughout the bandwidth.

Although the equivalent electrical length of the even mode impedance should be less one half wavelength to avoid degrading the desired odd mode, fortunately the permeability of the ferrites varies inversely with frequency to keep the electrical length more or less constant over several decades. The configuration and type of ferrite is best determined empirically for a given design, but pertinent material can be found in many references such as those cited above. The ferrite material of FIGS. 9A–9I is preferably an E-core ferrite to enable the coaxial winding to be separated from the core. Pot-cores can be used in a similar manner.

Figure 10A:
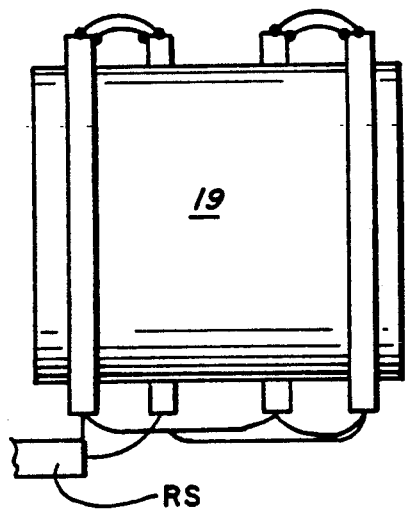
FIGS. 10A and 10B are construction illustrations of top and front views of another transmission line transformer of the form of FIG. 3 for the case of N equal to four.
Figure 10B:
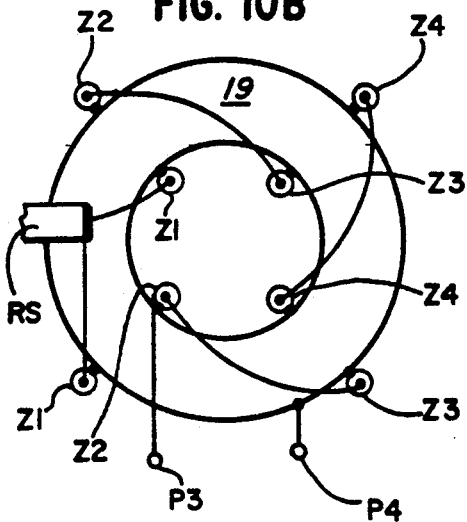
Figure 11A:
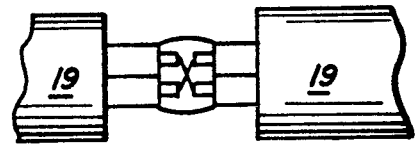
FIGS. 11A, 11B, 11C and 11D are construction illustrations of bottom, top, front and end views of another transmission line transformer of the form of FIG. 3 for the case of N equal to two.
Figure 11B:
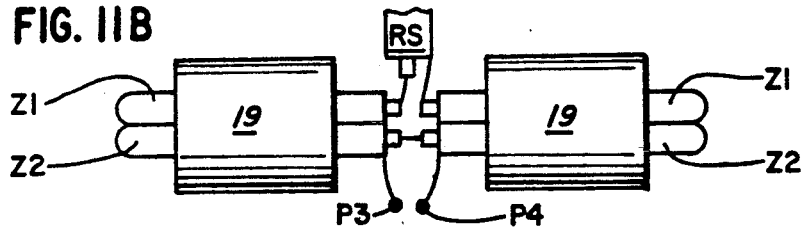
Figure 11C:
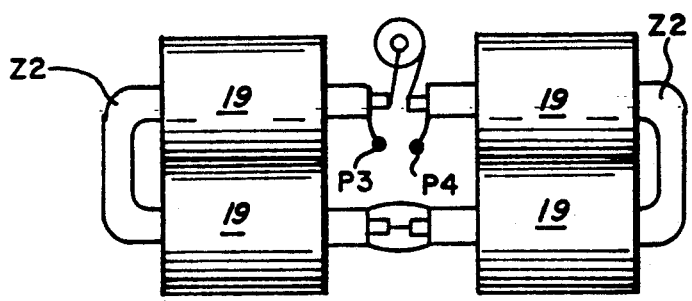
Figure 11D:
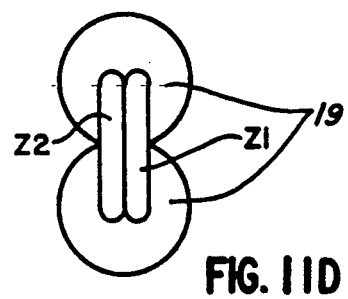

A preferred toroid construction is shown in FIGS. 10A and 10B. The source coaxial cable RS is fed through the center, and the circular output connection is continued at the desired load impedance RL with proper spacing of the outer and inner conductors.

FIGS. 11A, 11B, 11C and 11D show the use of a sleeve, or binocular, ferrite core with semi-rigid cable. A transformer was built and tested using this construction technique with a maximum insertion loss of 0.3 dB from 20 to 500 Mhz. Fair-rite #61, 0.5 in. long sleeves were used as the transmission line elements. Unfortunately, the only commercially available cable impedances which are close to the theoretical values given in FIG. 6A were Z1=25 and Z2=10 ohms. An electrical length at 500 Mhz of approximately fifteen percent of a wavelength per turn was used, and two 15 pF capacitors were added to the bottom connections shown in FIG. 11A to compensate for the parasitic inductance of the cross connections. The maximum input VSWR of 1.3L1 can be reduced further by using a lien impedances closer to the ideal values of Z1=21.7 ohms and Z2=7.23 ohms.

The phase for the DC isolation transformer of the present invention is not linear. The phase shift for electrical line lengths less than 180 degrees is always less than the same length used in a direct coupled transformer. Accordingly, it is contemplated that the transformer of the present invention can be used as a phase equalizer by judicially selecting the appropriate winding length for the transmission line elements ZN.

The primary advantage, however, is the elimination of high voltage, high current, low Q coupling capacitors in high power amplifier designs. However, it can also be successfully employed in low power applications. Since the ferrite must be large for high power transformers to avoid nonlinear magnetic effects, the winding lengths for the transmission line transformers 20 nd 30 can be appreciable fractions of wavelengths and the winding topology disclosed here can be most advantageously employed.

While particular embodiment has been disclosed, it should be appreciated that many variations can be made thereto without departing from the scope of the invention as defined in the appended claims.

I claim:

1. A transmission line transformer with DC isolation between a pair of inputs and a pair of outputs, comprising:

a first set of transmission line elements arranged in a selected series order of varying characteristic impedance, each element having a primary connected in series with primaries of the other elements of the first set between one of the pair of input terminals and an intermediate reference location between the pair of inputs, and each element having a secondary connected in parallel with the pair of output terminals; and a second set of transmission line elements arranged in a series order of varying characteristic impedance selected relative to the varying characteristic impedance of the first set of transmission line elements for optimum frequency independence and low insertion loss, each element of the second set having a primary connected in series with primaries of the other elements of the second set between the other one of the pair of input terminals and the intermediate reference location, and each element of the second set having a secondary connected in parallel with the pair of output terminals.

2. The transmission line transformer of claim 1 in which the reference location is at the interconnection between a transmission line element of each of the first and second sets that is most remote from the input terminals in said series connections.

3. The transmission line transformer of claim 1 in which the secondaries of selected ones of the transmission line elements of each set are connected in series, with each series connected group being connected in parallel across the pair of output terminals.

4. The transmission line transformer of claim 3 in which each group has only a pair of transmission line elements.

5. The transmission line transformer of claim 3 in which the elements of each group have characteristic impedances which are approximations of different ideal characteristic impedances selected for each element for optimum frequency impedance and low insertion loss.

6. The transmission line transformer of claim 3 in which all groups have the same number of transmission line elements.

7. The transmission lien transformer of claim 3 in which for each group of the first set there is another group of the second set having the same number of transmission line elements with substantially the same characteristic impedances and arranged symmetrically with respect to the intermediate reference location.

8. The transmission lien transformer of claim 3 in which the primaries of adjacent transmission line elements of each group are interconnected with each other.

9. The transmission line transformer of claim 3 in which the ratio of the characteristic impedances of the element having the highest characteristic impedance to the element having the lowest characteristic impedance for at least some of the groups is approximately between two and three.

10. The transmission line transformer of claim 1 in which the ratio of the characteristic impedances of N elements of each set is approximately equal to the ratio of the characteristic impedances $Z_n$ for N equal the natural numbers two through seven is substantially as follows:

| N | Z1 | Z2 | Z3 | Z4 | Z5 | Z6 | Z7 |
|---|--------|--------|--------|--------|-------|-------|-------|
| 2 | 21.651 | 7.217  |        |        |       |       |       |
| 3 | 23.570 | 11.785 | 0.000  |        |       |       |       |
| 4 | 24.179 | 19.780 | 9.234  | 2.074  |       |       |       |
| 5 | 24.507 | 21.944 | 12.913 | 4.627  | 0.000 |       |       |
| 6 | 24.700 | 23.205 | 18.758 | 10.437 | 4.324 | .951  |       |
| 7 | 24.789 | 23.713 | 20.746 | 13.352 | 6.824 | 2.420 | 0.000 |

11. The transmission lien transformer of claim 1 in which the ratio of the characteristic impedances of N elements of each set is approximately equal to the ratio of the characteristic impedance $Z_n$ for N equal to the natural numbers two through five is, as follows:

| | Impedances (Ohms) | | | | |
|---|---|---|---|---|---|
| N | Z1 | Z2 | Z3 | Z4 | Z5 |
| 2 | 25.000 | 10.000 | | | |
| 3 | 25.000 | 10.000 | 5.000 | | |
| 4 | 25.000 | 25.000 | 10.000 | 5.000 | |
| 5 | 25.000 | 25.000 | 12.500 | 5.000 | 5.000 |

12. The transmission line transformer of claim 1 including
a center transmission lien element at the intermediate reference location and connected between the first and second sets of transmission line elements,
said center transmission lien element having a primary connected in series with the primaries of adjacent elements of the first and second sets and a secondary connected in parallel across the pair of output terminals.

13. The transmission line transformer of claim 12 in which the center transmission line element has substantially the lowest impedance of all the elements of the first and second sets.

14. The transmission lien transformer of claim 12 in which the impedance of the center transmission lien element is approximately zero relative to the impedances of the elements of the first and second sets.

15. The transmission line transformer of claim 1 in which impedances of the transmission line elements generally increase in value in a direction outwardly from the central transmission line element location to the input terminals.

16. The transmission line transformer of claim 1 in which the characteristic impedances of the transmission line elements connected in series closest to the intermediate reference location are smaller than the characteristic impedance of elements connected further from the reference location.

17. The transmission line transformer of claim 12 in which for a load impedance RL connected across the output terminals and a source impedance RS of the amplifier, the characteristic impedances of N transmission line elements ZN, where N equals two, are defined by the formulas
$z1 = RL\sqrt{3}$, and
$Z2 = RL\sqrt{3}$,
where $RL = RS/4$ 18. The transmission line transformer of claim 12 in which for a load impedance RL connected across the output terminals and a source impedance RS of the amplifier, the characteristic impedances of N transmission line elements ZN, where N equals three, are defined by the formulas
$Z1 = \sqrt{RLRS} \times \sqrt{2}$,
$Z2 = \sqrt{RL \times RS}/\sqrt{2}$, and
$Z3 = 0$,
where $RL = RS/9$ 19. The transmission line transformer of claim 1 in which each of said first and second sets has only a pair of transmission line elements, one element of each set being located adjacent an element of the other set.

20. The transmission line transformer of claim 19 in which the two adjacent elements have characteristic impedances approximately equal to one third the characteristic impedance of the other two elements.

21. The transmission line transformer of claim 19 including a center transmission lien element at the reference location and connected between said two adjacent elements having an impedance of approximately zero relative to the impedances of the other elements of the first and second sets.

22. The transmission line transformer of claim 1 including a center transmission line element at the intermediate reference location and connected between two adjacent transmission line elements of the first and second sets, said center transmission line element having an electrical length substantially greater than that of said transmission lien elements of the first and second sets.

23. The transmission lien transformer of claim 22 in which said electrical length of the center transmission lien element is approximately double that of the transmission line elements of the first and second sets.

24. The transmission line transformer of claim 1 in which said transmission line elements are formed of coaxial line.

25. The transmission line transformer of claim 1 in which the transmission line elements are formed of a twin lead line.

26. The transmission line transformer of claim 1 in which each of said transmission line elements is at least partially turned around a ferrite core.

27. The transmission lien transformer of claim 1 in which all transmission lien elements are turned around a commonly shared ferrite core.

28. The transmission line transformer of claim 1 in which each of the transmission line elements of the first and second sets has a half turn around a ferrite core.

29. The transmission line transformer of claim 1 in which at least some of the varying characteristic impedances of the first set of transmission elements mirrors the varying characteristic impedances of the first set of transmission line elements relative to the intermediate reference location.

30. The transmission line transformer of claim 1 in which at least some of the transmission lien elements are discrete elements with primaries and secondaries interconnected by electrical conductors.

* * * * *